United States Patent [19]

De Nora et al.

[11] 3,976,512
[45] Aug. 24, 1976

[54] METHOD FOR REDUCING THE DEFECT DENSITY OF AN INTEGRATED CIRCUIT UTILIZING ION IMPLANTATION

[75] Inventors: Vittorio De Nora, Nassau, Bahamas; Bohumil Polata, Los Altos, Calif.

[73] Assignee: Signetics Corporation, Sunnyvale, Calif.

[22] Filed: Sept. 22, 1975

[21] Appl. No.: 615,481

[52] U.S. Cl. ................... 148/1.5; 29/578; 29/580; 148/175; 148/187; 357/20; 357/34; 357/48; 357/88; 357/89; 357/91
[51] Int. Cl.² ............... H01L 21/265; H01L 21/20; H01L 29/06
[58] Field of Search ................ 148/1.5, 175, 187; 29/578, 580; 357/20, 34, 48, 88–91

[56] References Cited
UNITED STATES PATENTS

| | | | |
|---|---|---|---|
| 3,260,902 | 7/1966 | Porter | 148/175 X |
| 3,283,223 | 11/1966 | DeWitt et al. | 357/89 X |
| 3,436,282 | 4/1969 | Shoda | 148/187 |
| 3,510,736 | 5/1970 | Dingwall | 357/34 |
| 3,600,241 | 8/1971 | Doo et al. | 148/175 |
| 3,717,790 | 2/1973 | Dalton et al. | 148/1.5 |
| 3,902,926 | 9/1975 | Perloff et al. | 148/1.5 |
| 3,916,431 | 10/1975 | Khajezadeh | 357/34 X |

OTHER PUBLICATIONS

Edel et al., "Stress Relief by Counterdoping" I.B.M. Tech. Discl. Bull., vol. 13, No. 3, Aug. 1970, p. 632.
Shepard et al., "Epitaxial Isolation and Device Fabrication" Ibid., vol. 13, No. 9, Feb. 1971, pp. 2548–2549.
Edel. W. A., "Stacking Fault Free Epitaxial Layers" Ibid., vol. 14, No. 5, Oct. 1971, p. 1654.

*Primary Examiner*—L. Dewayne Rutledge
*Assistant Examiner*—W. G. Saba
*Attorney, Agent, or Firm*—Flehr, Hohbach, Test, Albritton & Herbert

[57] ABSTRACT

The buried layer of an integrated circuit is produced by use of a grated mask. The growth of silicon dioxide in the exposed areas of the grate forms a stepped surface. Thereafter ion implantation in these areas and then merging the implanted regions forms a single buried region having a corrugated surface on which an epitaxial layer is grown. Such corrugated surface reduces the defect regions in the epitaxial layer.

1 Claim, 6 Drawing Figures

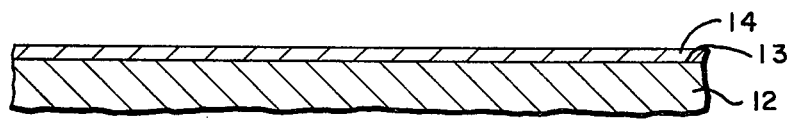
FIG.—1A
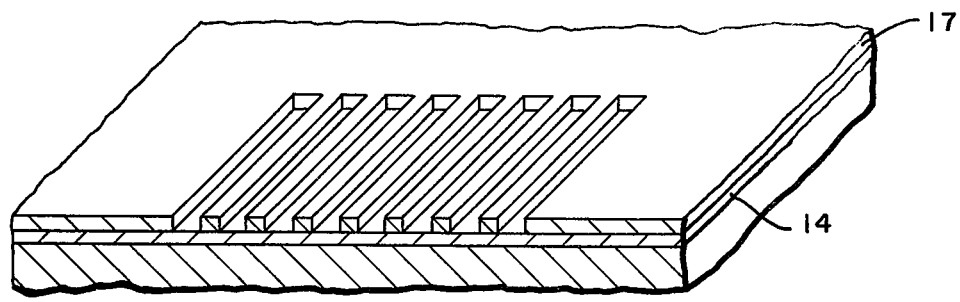
FIG.—1B
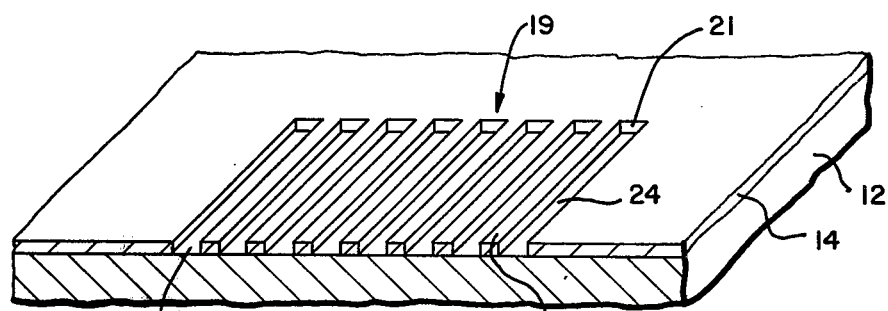
FIG.—1C
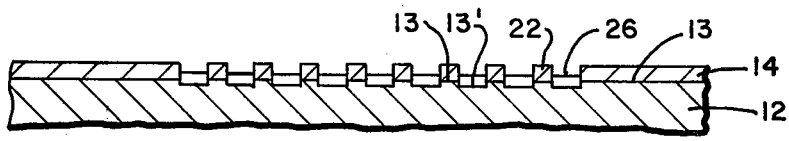
FIG.—1D
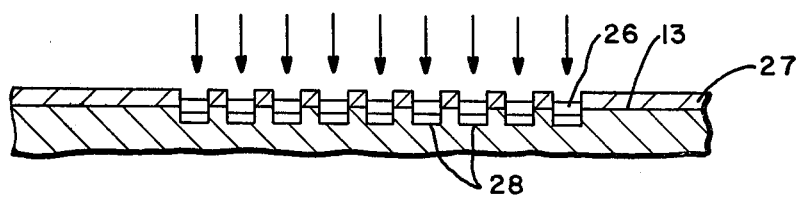
FIG.—1E
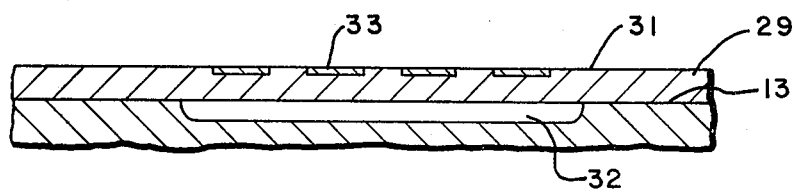
FIG.—1F

METHOD FOR REDUCING THE DEFECT DENSITY OF AN INTEGRATED CIRCUIT UTILIZING ION IMPLANTATION

BACKGROUND OF THE INVENTION

The present invention is directed to a method for reducing the defect density of an integrated circuit.

It is presently assumed that most of the defects of a semiconductor layer are mobile at high temperatures. As a result they seem to travel during diffusion and concentrate in some areas.

Such defect regions reduce the overall yield in the manufacture of an integrated circuit.

OBJECT AND SUMMARY OF THE INVENTION

It is, therefore, an object of the present invention to provide a method of reducing the defect density of an integrated circuit.

In accordance with the above object there is provided a method for reducing the defect density of an integrated circuit having a semiconductor substrate. A buried region and an epitaxial layer are grown over the substrate and buried region. The epitaxial layer includes a plurality of integrated devices occupying a predetermined extended area which is substantially coextensive with the buried region. The method comprises the following steps. A semiconductor substrate having a surface is provided. A grated mask on the surface is formed having elongated alternate portions respectively covering and exposing the surface. A relatively thin, compared to the mask, protective layer is formed covering exposed portions of the surface by an oxide growth technique in which a portion of the substrate is used up in the formation of the thin layer. Conductivity determining impurities are caused to pass through the protective layers and into the semiconductor body to form a plurality of elongated regions. The elongated regions are merged into a single region. An epitaxial layer is grown over the substrate and single region.

BRIEF DESCRIPTION OF THE DRAWINGS

FIGS. 1A through 1F are cross-sectional and perspective views illustrating the method of the present invention.

DETAILED DESCRIPTION OF THE PREFERRED EMBODIMENT

Referring to FIG. 1A, a semiconductor body 12 having a substantially planar surface 13 is first provided. Body 12 may be of P conductivity type and having a resistivity ranging from 8 to 26 ohm-cm. A first masking layer 14 is formed on surface 13 and may be a silicon dioxide layer thermally grown. Layer 14 may have a thickness varying from 0.3 to 1 micron as desired depending on the implantation voltage and the particular impurity to be later implanted.

Referring to FIG. 1B, a photoresist layer 17 is next formed on layer 14 having a grated pattern covering an extended preselected area for formation of a region in body 12, such as a buried layer region. Using conventional photolithographic techniques, a grated mask 19 (FIG. 1C) is formed on surface 13 having a plurality of elongated portions 21 removed and alternate remaining portions 22 remaining intact. This defines a grated mask extending over the predetermined area of surface 13 in which the extended region is to be formed.

The elongated openings or apertures 21 formed in layer 14 expose a plurality of elongated semiconductor body portions 24. The width of the remaining elongated portions 22 may typically be from 4 to 6 microns. It is further possible to reduce their width to 1 micron or less dependent only on the particular techniques used.

Next referring to FIG. 1D, a relatively thin protective layer 26 of silicon dioxide is formed on the surface 13 in exposed body portions 24. Layer 26 need only be of sufficient thickness to provide a physical covering to protect surface 13 during a subsequent implantation step and a thermal diffusion step. Layer 26 must be sufficiently thin to permit the passage of a substantial portion of directed implanted ions therethrough during the formation of the extended region desired.

More importantly however the thermal growth of thin layer 26 entails the using up of approximately one-half of its thickness in silicon body 12. Thus, due to this oxide growth a step or corrugation is formed since the new surface 13' in body portions 24 is below surface 13.

Referring to FIG. 1E, the next step is the implantation of the desired impurity such as arsenic. An energy level of 200KeV may be utilized for arsenic impurities to provide a depth of approximately 0.3 microns in body 12 spaced from surface 13 as shown by plural regions 28. These regions may then be thermally diffused to a greater depth of 3 to 4 microns. In the case of implantation of boron impurities, a similar energy level will provide a depth of 1 to 1.5 microns.

Next, as illustrated in FIG. 1F, regions 28 when subjected to elevated temperatures merge to form a single buried region 32. Region 32 although illustrated as having a smooth surface 13, actually has a microscopically corrugated surface due to the growth of the thin oxide layer as discussed above. Because arsenic has a relatively slow diffusion coefficient and further because the regions have been substantially formed by ion implantation, the final buried layer 32 is precisely formed and is substantially defined by the outer periphery of the grated mask. Ion implantation may be advantageously used to provide a peak of the impurity concentration somewhat below surface 13. This is advantageous over formation by thermal diffusion in that the maximum concentration at the surface would otherwise provide increased out diffusion during the subsequent high temperature epitaxial deposition step.

Lastly as illustrated in FIG. 1F, before formation of the epitaxial layer 29 the silicon dioxide layers 26 and 27 are removed by conventional etching. After epitaxial layer 29 is formed a plurality of devices are integrated into the layer as illustrated by regions 33.

As a consequence of the corrugated surface of buried layer 32 the quality of the subsequently formed epitaxial layer 29 is improved because strain is relieved in the associated epitaxial layer by the corrugated surface in the implanted buried layer areas and thus the major cause at epitaxial defects is eliminated. For example, an area sufficient to underly 100 or more emitters has been provided with at least a 10 to 1 reduction in defect count. In fact, improvements as great as 100 to 1 in reducing defects with correspondingly increased yield are expected to occur. It is believed that the corrugated surfaces where the impurity is implanted provide a mechanism for permitting the atoms to readjust themselvers without introducing extensive irreparable defects which are normally associated with the formation of an epitaxial silicon layer. As discussed above, during diffusion it is believed that defects concentrate in some areas due to stresses. It has been observed that large areas of buried layers seem to have or cause larger defect densities. Thus by effectively breaking up the large area by use of corrugations the defect density is reduced.

What is claimed is:

1. In a method for reducing the defect density of an integrated circuit having a semiconductor substrate, a buried region and an epitaxial layer grown over said substrate and buried region, said epitaxial layer including a plurality of integrated devices occupying a predetermined extended area which is substantially coextensive with said buried region said method comprising the following steps: providing a semiconductor substrate having a surface; forming a grated mask on said surface having alternate elongated portions respectively covering and exposing said surface; forming a relatively thin, compared to said mask, protective layer; covering exposed portions of said surface by a thermal oxide growth technique in which a portion of said substrate is used up in the formation of the thin layer; ion-implanting conductivity determining impurities through said protective layers and into said semiconductor body to form a plurality of elongated regions; merging said elongated regions into a single region; and growing said epitaxial layer over said substrate and single region.

* * * * *

UNITED STATES PATENT AND TRADEMARK OFFICE
CERTIFICATE OF CORRECTION

PATENT NO. : 3,976,512
DATED : August 24, 1976
INVENTOR(S) : Vittorio De Nora and Bohumil Polata It is certified that error appears in the above-identified patent and that said Letters Patent are hereby corrected as shown below:

Delete the name of "Vittorio De Nora" as inventor.

Signed and Sealed this

Eighth Day of March 1977

[SEAL]

Attest:

RUTH C. MASON
*Attesting Officer*

C. MARSHALL DANN
*Commissioner of Patents and Trademarks*